United States Patent [19]

Blanchard et al.

[11] Patent Number: 4,963,953
[45] Date of Patent: Oct. 16, 1990

[54] CHARGE TRANSFER DEVICE AND METHOD FOR PRODUCING SUCH A DEVICE

[75] Inventors: Pierre Blanchard, Echirolles; Michel Carquet, Beziers, both of France

[73] Assignee: Thomson-CSF, Paris, France

[21] Appl. No.: 396,797

[22] Filed: Aug. 21, 1989

Related U.S. Application Data

[63] Continuation of Ser. No. 920,446, Oct. 20, 1986, abandoned.

[30] Foreign Application Priority Data

Oct. 22, 1985 [FR] France .................. 85 15664

[51] Int. Cl.⁵ .............................................. H01L 29/78
[52] U.S. Cl. ...................................................... 357/24
[58] Field of Search ........................................... 357/24

[56] References Cited

PUBLICATIONS

RCA Review, vol. 34, No. 1, Mar. 1973, pp. 164–202, Princeton, N.J., U.S.; W. F. Kosonocky et al.: "Two-phase Chargecoupled Devices with Overlapping Polysilicon and Aluminium gates".
Fujitsu Scientific & Technical Journal, vol. 11, No. 3, Sep. 1975, pp. 79–99, Kawasaki, JP; H. Sei et al.
Fujitsu Scientific & Technical Journal, vol. 11, No. 3, Sep. 1975, pp. 101–119, Kawasaki, JP; K. Tanikawa et al.

Primary Examiner—Robert S. Macon
Attorney, Agent, or Firm—Oblon, Spivak, McClelland, Maier & Neustadt

[57] ABSTRACT

A charge transfer device in which, during manufacture, a first upper electrode does not entirely cover a space separating two lower electrodes, and the zone thus left free is filled by a conductive material of the same type as the first upper electrode part. The method according to the invention allows simple manufacture without restrictions as to the positioning of the masks for manufacturing the electrodes, and allows manufacture without covering of the upper and lower electrodes, thereby allowing to reduce the stray capacities.

2 Claims, 2 Drawing Sheets

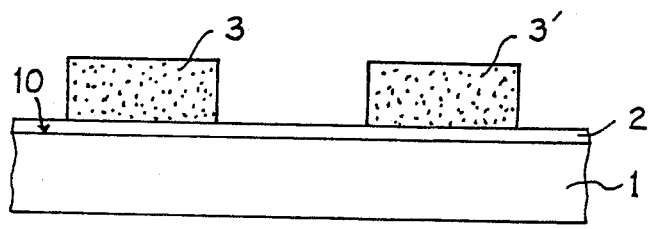
Fig.1
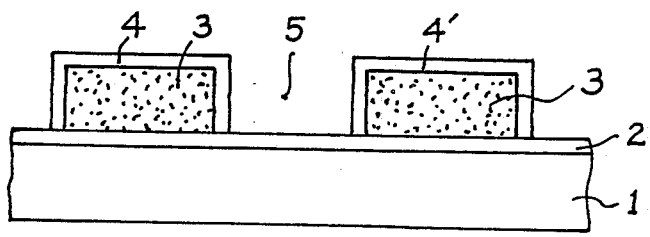
Fig.2
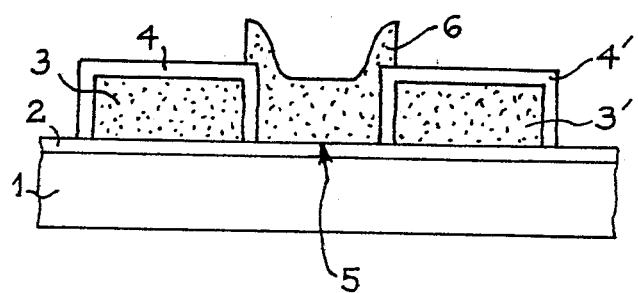
PRIOR ART Fig.3

CHARGE TRANSFER DEVICE AND METHOD FOR PRODUCING SUCH A DEVICE

This application is a continuation of application Ser. No. 920,446, filed on Oct. 20, 1986, now abondoned.

BACKGROUND OF THE INVENTION

1. Field of the Invention

The invention relates to a charge transfer device and the method for producing said device. It concerns more particularly charge transfer devices provided with two electrode levels. The charge transfer device obtained allows to control the potential over the entire surface area of the device. Furthermore, the method for producing this charge transfer device does not require overlapping the electrodes of the two electrode levels and consequently does not demand stringent manufacturing accuracy.

Charge transfer devices currently manufactured must increasingly conform to manufacturing standards for Very Large Scale Integration integrated circuits, called VLSI integrated circuits.

The increasingly reduced dimensions of VLSI circuits impose not only high-performance resolution photolithography, but also required highly accurate positioning. For charge transfer devices having two electrode levels, the positioning of the second electrodes level with respect to the first level is essential for correct operation of the device. This positioning accuracy is increasingly difficult to obtain as the dimensions of the plates are increased. The charge transfer devices according to the invention allows to overcome the difficulties of positioning.

SUMMARY OF THE INVENTION

The present invention relates to a charge transfer device comprising one face of a substrate made of doped semi-conductor and covered with an insulating material, at least two lower electrodes separated by a space and covered with an insulating material, also comprising at least one upper electrode covering a first part of the space, and one portion of the said lower electrodes, as well as an element made of conductive material covering a second part of the space located between the upper electrode and the insulating layer of the other lower electrode.

The invention also concerns a method for producing a charge transfer device comprising the following different successive phases:

a first phase of producing a layer of an insulating material on one face of a substrate made of doped semiconductor material;

a second phase of depositing on the layer of insulating material a first layer of a conductive material;

a third phase of engraving in the said first layer of conductive material of at least two lower electrodes separated by a space;

a fourth phase of producing on the lower electrodes a layer of an insulting material;

a fifth phase of producing on the assembly thus obtained a layer of a conductive material;

a sixth phase of engraving, in the layer of conductive material, at least one upper electrode, wherein the upper electrode produced during the sixth phase covers a first part of the space and a part of the lower electrode, and further comprising a seventh phase for producing a layer of conductive material on the assembly of the upper and lower electrodes, and an eighth phase of eroding the layer of conductive material in order to produce elements formed to conductive material covering a second portion of the channel.

BRIEF DESCRIPTION OF THE DRAWINGS

The different objects, features and advantages of the invention will become apparent from the following description, given by way of non-limitative examples, with reference to the appended drawings which represent:

at FIGS. 1. 2, 4, 5, and 6, the different phases of the manufacturing method according to the invention;

Figure 7:
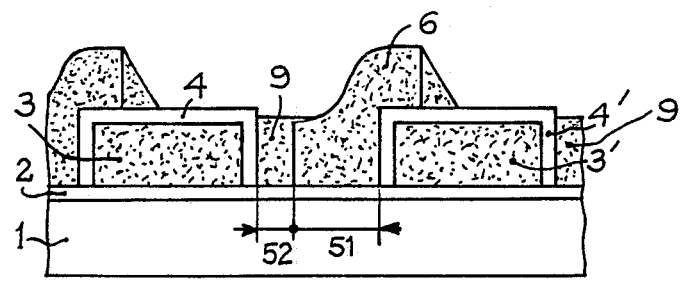

at FIG. 3 a charge transfer device of a known type;

at FIG. 7 a charge transfer device according to the invention.

On the different figures, the same elements bear the same reference numerals.

FIG. 3 represents a charge transfer device according to the state of the art.

DESCRIPTION OF THE PREFERRED EMBODIMENTS

A substrate 1 made of semiconductor material, such as monocrystalline silicon, for example, is covered with a layer 2 of an insulating material such as an oxide layer.

On layer 2 are disposed electrodes 3 and 3' (storage grids, for example) that will be herein-after referred to as "lower electrodes". They are covered with a layer 4 and 4' of an insulating material such as an oxide. These electrodes are clearly separated from each other and determine an inter-electrode space 5.

In the prior art, electrode 6 (or transfer grid for example) which will be called upper electrode in the following description, covers space 5 as well as a portion of the upper electrodes 3 and 3' on each side of space 5, as shown in FIG. 3.

The obtainment of the charge transfer device such as represented in FIG. 3 can create problems in obtaining an upper electrode 6 that covers the lower electrodes 3 and 3'.

The invention thus concerns a method allowing the easy obtainment of such a charge transfer device.

During a first phase, on a face 10 of a substrate 1, is produced a layer 2 of an insulating material. This material can be an oxide such as silica.

On the layer 2, is thereafter deposited a layer of a conductive material such as polycrystalline silicon. In this latter layer are etched by photo-engraving, or any other etching method, the lower electrodes 3 and 3'. A structure such as represented in FIG. 1 is thus obtained with relatively narrow electrodes that are fairly close together. It is thus possible to produce electrodes having a width of about 2.5 μm and spaced apart from one another by about 2.5 μm.

The electrodes 3 and 3' are thereafter covered on their upper part and their sides, with a layer of insulating material. The electrodes 3 is covered with a layer 4, while the electrode 3' is covered with a layer 4'. A structure such as represented on FIG. 2 is thus obtained.

The assembly such as obtained is covered with a conductive material such as polycrystalline silicon. This layer is engraved, for example, by photolithotechniques, in order to obtain upper electrode parts, such as 6 which cover portions of the spaces 5 located between the lower electrodes 3 and 3'. This method must allow obtainment of a charge transfer device in which the entire space 5 is covered by an upper electrode. However, to accomplish that in one phase would require high accuracy for the engraving operation.

Figure 4:
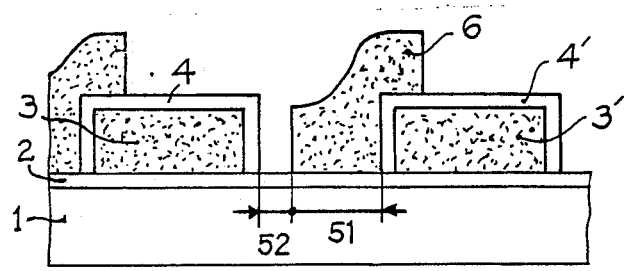

In fact, the upper electrode part 6' formed according to the present invention will have a width very slightly greater than the space, i.e. about 2.5 μm, with a positioning error that leads to producing an arrangement such as represented in FIG. 4 where the non-covered surface 52 can reach a value of 0.5 μm.

Thus, the upper electrode part 6' covers zone 51 of the space 5 while the zone 52 is not covered and would constitute a zone not controlled by the electrodes and which could prevent correct transfer of the charges if no other measures were taken.

Figure 5:
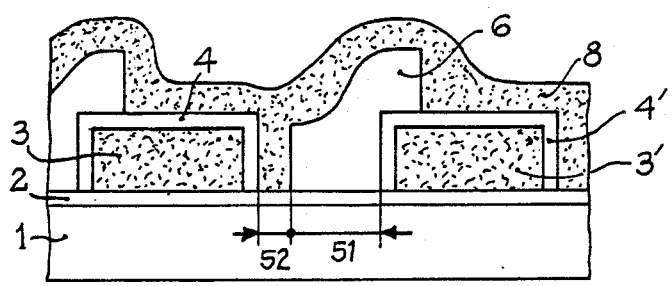
Figure 6:
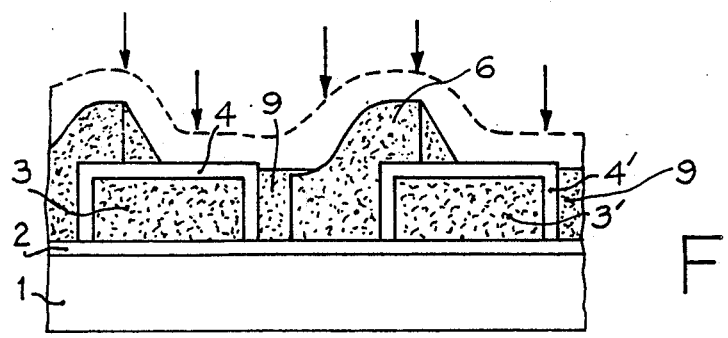

According to the present invention, a further phase for depositing a layer 8 of the same kind as layer 6' is thus performed, over the whole of FIG. 4, such as represented in FIG. 5.

The layer 8 is thereafter erroded or oxidized, so as to separate the adjacent upper electrodes, while ensuring the complete covering of the interelectrodes space 5 by means of an upper electrode part 9 covering the zone 52 and forming a part of the upper electrode along with the upper electrode part 6'.

The process according to the invention suppresses the need inherent in current devices of providing a covering in order to overcome any possible incorrect positionings of the electrode levels. This allows a substantial reduction of the dimensions and a considerable decrease of the stray capacities due of the coverings.

In the particular case of charge transfer devices operating according to the two phase mode, it is preferable to favorize storage electrodes with respect to transfer electrodes.

The former methods, due to the overlappings necessary between the electrode levels, lead to producing lower electrodes 3, 3' that are wider than the upper electrodes 6. This is the reason why the lower electrodes are assigned to the storage and the upper electrodes to the charge transfer.

In this method, the width of the lower electrodes 3, 3' tends to be reduced during manufacture (overengraving, oxidation . . .) thereby provoking and increase in the width of the upper electrodes each formed of parts 6', 9. This leads to the functions assigned to the two electrode levels being inversed.

What is claimed is:

1. Method for producing a charge transfer device comprising the following different successive phases:
    a first phase of producing a layer of insulating material on one face of substrate made of amorphous semi-conductor material;
    a second phase of depositing on the layer of insulating material a first layer of a conductive material;
    a third phase of engraving in the said first layer of conductive material at least two lower electrodes separated by a space;
    a fourth phase of producing on the lower electrodes a layer of an insulating material;
    a fifth phase of producing on the assembly thus obtained a layer of a conductive material;
    a sixth phase, in the layer of conductive material, deposited during fifth phase, of engraving the conductive material produced in said fifth phase to produce a first upper electrode part covering a first portion of the space and a portion of one of the lower electrodes;
    a seventh phase of producing a layer of the same material as during the fifth phase on the assembly of the first upper electrode part and the lower electrodes; and
    an eighth phase of eroding or oxidizing the layer of conductive material produced in the seventh phase in order to produce a conductive second upper electrode part covering a remaining second portion of the space between the first upper electrode part and the layer of insulating material formed on the other lower electrode.

2. A method for producing a charge transfer device, comprising the following different successvie steps:
    a first step of producing an insulating layer on one face of a semiconductor substrate;
    a second step of depositing a first layer of conductive material on said insulating layer;
    a third step of engraving in the first conductive layer at least two lower level electrodes separated by a space;
    a fourth step of producing on the lower level electrodes a layer of insulating material;
    a fifth step of depositing a second layer of conductive material;
    a sixth step of engraving the second conductive layer so as to define a first portion of an upper electrode in the space between said two lower level electrodes, while leaving at most a narrow uncovered interval between said first portion and each of said two lower level electrodes;
    a seventh step of depositing a third layer of conductive material in the said narrow interval and above said narrow interval as well as above the upper and lower electrodes; and
    an eighth step of eroding or oxidizing the third layer so as to completely remove the third layer above at least a portion of said lower level electrodes without removing the third layer in the said narrow interval.

* * * * *